United States Patent
Su et al.

(10) Patent No.: US 6,948,619 B2
(45) Date of Patent: Sep. 27, 2005

(54) RETICLE POD AND RETICLE WITH CUT AREAS

(75) Inventors: Wei-Yu Su, Taipei (TW); Li-Kong Tern, Taichung (TW); Dong-Hsu Cheng, Hsin-Chu (TW)

(73) Assignee: Taiwan Semiconductor Manufacturing Co., LTD, Hsin Chu (TW)

( * ) Notice: Subject to any disclaimer, the term of this patent is extended or adjusted under 35 U.S.C. 154(b) by 263 days.

(21) Appl. No.: 10/190,272

(22) Filed: Jul. 5, 2002

(65) Prior Publication Data

US 2004/0005209 A1 Jan. 8, 2004

(51) Int. Cl.⁷ .............................................. B65D 85/90
(52) U.S. Cl. ...................................... 206/710; 206/454
(58) Field of Search ................................ 206/710, 719, 206/723, 454

(56) References Cited

U.S. PATENT DOCUMENTS

| | | | | |
|---|---|---|---|---|
| 4,842,136 A | * | 6/1989 | Nakazato et al. | 206/454 |
| 5,743,409 A | * | 4/1998 | Nakahara et al. | 206/710 |
| 5,869,395 A | * | 2/1999 | Yim | 438/637 |
| 6,196,391 B1 | * | 3/2001 | Li | 206/719 |
| 6,216,873 B1 | * | 4/2001 | Fosnight et al. | 206/710 |
| 6,247,599 B1 | * | 6/2001 | Cheng et al. | 206/723 |

* cited by examiner

Primary Examiner—Bryon P. Gehman
(74) Attorney, Agent, or Firm—Tung & Associates

(57) ABSTRACT

A pod for transporting reticles is made with a reticle support that has a Π-shape and is provided with pins, whose arrangement matches the location of chrome-free areas on a reticle base. Due to that, the pins, when supporting the reticle, come into contact with the reticle in chrome-free areas thereof. Thus, scratching the metallic areas and releasing metallic particles is prevented from occurring.

10 Claims, 2 Drawing Sheets

RETICLE POD AND RETICLE WITH CUT AREAS

BACKGROUND OF THE INVENTION

1. Field of the Invention

The present invention relates in general to semiconductor technology, and more specifically to a reticle pod. Even more specifically, the invention relates to a novel support of the reticle pod.

2. Description of the Related Art

In the semiconductor fabrication process, a square cross-sectional or rectangular cross-sectional container made of a plastic material is frequently used to transport articles. These articles may include silicon wafers, reticles or other substrates used for building IC devices. A reticle is a transparent ceramic substrate that is coated with a metallic layer forming a pattern for an electronic circuit. It is generally used in an imaging step during a photolithographic process wherein a pattern of a circuit is reproduced on the surface of an electronic substrate, i.e., on a wafer surface.

Reticle containers have been known in the art. In the U.S. Pat. No. 4,719,705 issued to Laganza et al., an adjustable transporter for moving a reticle past an optical slit as a step in the production of semiconductor wafers is disclosed. The reticle stage rides along a pair of optically flat planar, intersecting, bearing surfaces supported by air bearings on each bearing surface. Pressurized air and vacuum may be simultaneously employed to effect substantially friction-free motion while preventing displacement from the bearing surfaces. Axial adjustments on each air bearing permit precise adjustment of the reticle stage and reticle.

Disclosed in the U.S. Pat. No. 4,842,136 issued to Nakazato et al. is a dust-proof container for keeping a mask or reticle usable to transfer a pattern onto a semiconductor wafer for the manufacture of integrated circuits. The container includes a casing, within which supporting pins for supporting the mask or reticle are formed. Also, in the casing, there are provided leaf springs for pressing the mask or reticle toward the supporting pins, and a releasing mechanism for releasing the reticle pressing force of the leaf springs. The releasing mechanism is responsive to a non-mechanical signal such as an electric signal to release the reticle pressing force. A shape memory alloy may be usable in the releasing mechanism. An opening/closing mechanism is provided to open/close a door, which is operable to cover an opening formed in the casing for the insertion and extraction of the mask or reticle. A shape memory alloy may be used in the opening/closing mechanism. With the dust-proof container of the invention, the necessity of use of a mechanical-signal transmitting system such as a linkage or otherwise in the casing is avoided. This effectively prevents creation of dust or foreign particles within the casing due to mechanical friction contact. Also, the possibility of adhesion of dust or foreign particles to the mask or reticle contained in the container can be minimized.

In the U.S. Pat. No. 5,314,068 issued to Nakazato et al., a container for a plate-like article, such as a reticle, includes a bottom member having a holding portion for holding the article in a substantially laid-down state; an upper member to be mated with the bottom member to define a space above the upper surface of the article; a pressing member for resiliently pressing in the space the article against the holding portion; and a fixing portion having an engaging member supported by the upper member and engageable with an end portion of the bottom member. The engaging member is effective to prevent upward opening motion of the upper member due to a reaction force of the pressing member. In addition, a releasing portion is partially projectable into the fixing portion to press the same in the same direction as the direction of the opening motion of the upper member to thereby release the engaging member.

The U.S. Pat. No. 5,727,685 issued to Laganza et al. discloses a cassette or box for containing and holding a planar substrate such as a reticle. The box has a clamp bar coupled to corner supports by a spring or flexure and a linkage. The clamp bar is pivotally attached to bottom corner supports and a spring or flexure and linked to a top corner support, such that movement of the load bar causes the corner supports to pivot away from a reticle being held only at the corners. An elevation bar is also used to preposition the reticle in one direction.

A reticle support mechanism is disclosed in the U.S. Pat. No. 6,216,873 issued to Fosnight et al. In the mechanism, a reticle may be quickly and easily located and removed, and it is capable of securely supporting a reticle for storage and/or transport. An embodiment of the mechanism includes a pair of reticle supports mounted to a door of a container, and a pair of reticle retainers mounted to a shell of the container. When the container shell is coupled with the container door, sections of the reticle support and reticle retainer engage chamfered edges of the reticle and sandwich the reticle in a secure position within the container. As a result of engaging the reticle at its chamfered edges, potentially harmful contact with the upper and lower surfaces and vertical edges of the reticle is avoided.

A reticle container equipped with a metal shield is disclosed in the U.S. Pat. No. 6,247,599 issued to Cheng et al. In a preferred embodiment, the container includes a container body constructed of a top lid, a bottom lid and four side panels forming a cavity therein, wherein one of the four side panels allows access to the cavity. The top lid, the bottom lid and the four side panels are made of an electrically insulating material, at least four support means mounted on the bottom lid in a spaced-apart relationship for supporting the insulating article thereon. An electrically conductive layer substantially overlaps the bottom lid so as to sufficiently shield the insulating article when positioned on the support means.

The container may further include a metallic knob situated in a top lid. The electrically conductive layer can be formed of a metallic material, or may be formed of a metallic material that does not produce contaminating particles, or may be formed of stainless steel. The electrically conductive layer may also be encapsulated as an insert in the bottom lid. The top lid, bottom lid and four sidewall panels may be formed of a substantially transparent plastic material. The container may further include an insert of an electrically conductive layer molded in the bottom lid. The container may further include a metal shield shaped substantially similar to the top lid for positioning between the top lid and the insulating article to form a metal enclosure with the electrically conductive layer on the bottom lid surrounding the insulating article.

In another preferred embodiment, the container, which is equipped with a metal shield surrounding an insulating article, includes a container body constructed of a top lid, a bottom lid and four side panels forming a cavity therein. One of the four sidewall panels allows access to the cavity, the top lid, bottom lid and four side panels may be formed of an electrically insulating material. There is a plurality of support means on the bottom lid for supporting the insulating article. The metal layer substantially covers the bottom lid and a cup-shaped metal enclosure positioned between the top lid and the insulating article cooperating with the metal layer on the bottom lid to substantially surround the insulating article. In the container, the metal layer and the cup-shaped metal enclosure may be formed of a contaminating particle-free metallic material. The container may further include a metal knob situated in the top lid. The metal layer may be formed as an insert in the bottom lid. The container may further include a second metal layer being molded as an insert in the bottom lid. The top lid, bottom lid and four side panels may be formed of a substantially transparent plastic material. The metal layer and the cup-shaped metal enclosure may be formed of stainless steel. The insulating article positioned on the plurality of support means may be a chrome coated quartz reticle plate.

The electrostatic discharge-free container may be a reticle pod for storing chrome coated reticle plate. In still another preferred embodiment, a container includes a metal enclosure for shielding an insulating article therein including a container body constructed of a top lid, a bottom lid and four side panels forming a cavity therein wherein one of the four side panels allows access to the cavity. The top lid, bottom lid and four side panels are formed of an electrically insulating material. There is a plurality of support means on the bottom lid for supporting the insulating article, a metal layer molded as an insert substantially overlaps the bottom lid, a cup-shaped metal enclosure positioned juxtaposed to the top lid cooperating with the metal layer to substantially surround the insulating article, and a metal knob situated in the top lid. The container may further include a second metal layer molded as an insert in the bottom lid. The metal layer and the cup-shaped metal enclosure may be fabricated of a contaminating particle-free metallic material.

A reticle SMIF pod for in situ orientation is disclosed in the U.S. Pat. No. 6,338,409 issued to Neary et al. The SMIF pod comprises a pod door. A pod cover is removably receivable on the door to define an interior space. A nest assembly has a plate resting on the pod door in the interior space and a core extending downwardly from the plate through an opening in the pod door. The plate is rotatably mounted on the pod door to selectively orient a workpiece, supported on the plate, in use.

Alignment means align the plate relative to the pod door in one of plural orthogonal positions. The pod door comprises an upper door plate and a lower door plate and a latch mechanism disposed therebetween for latching the pod door to the pod cover. The alignment means comprises an alignment leg extending downwardly from the plate and plural spaced apart bores in the pod door for selectively receiving the alignment leg. The alignment means may comprise plural alignment legs extending downwardly from the plate and plural spaced apart bores in the pod door each for receiving one of the alignment legs. The alignment means comprises a locking tab extending radially from the core and plural seats orthogonally positioned in the door for selectively receiving the locking tab. The alignment means may comprise plural orthogonally spaced locking tabs extending radially from the core and plural seats orthogonally positioned in the door each for receiving one of the locking tabs. Means is provided for biasing the plate downwardly against the pod door. The nest assembly comprises a flange on the core. The biasing means comprises a retaining spring disposed between the pod door and the flange. The pod door comprises an upper door plate and a lower door plate and the flange is sandwiched between the upper door plate and the lower door plate. The core includes a downwardly facing groove for actuation by an external engagement device to effect rotation of the plate.

Also, a conventional pod known to the applicants, which is used for transporting reticles, is shown in FIG. 1. The pod 10 comprises an upper cover 12 with a handle 14 affixed to the cover for easy carrying the pod by an operator, an upper liner 16, a support 18 for a reticle base 20, a lower liner 22, and a lower cover 24. The configuration of the support 18 relative to the reticle, and especially with regard to the reticle chrome coating (not shown in FIG. 1) is such that during transportation the chrome coating can be scratched by the support thus releasing chrome particles, which is highly undesirable.

SUMMARY OF THE INVENTION

Therefore, the general object of the present invention is to provide a reticle pod that being as advantageous and convenient as the pod known from the prior art would be free from its disadvantages.

More specific object of the present invention is to provide a reticle pod of such a structure where the reticle chrome coating is not being scratched during transportation.

According to the invention, these objects are attained by providing a reticle pod comprising an upper cover, an upper liner, a support for the reticle, a lower liner, and a lower cover, in which pod the support is made in the form of a Π-shape element and is provided with pins arranged to keep the reticle support from contacting a reticle metallic layer when supporting the reticle.

The pins are arranged to come into contact with the reticle in areas of a reticle base surface that are free from the metallic layer.

A reticle comprising a base and a metallic coating deposited on a surface of the base is made with reticle base free from the metallic coating in selected areas of the base surface that come into contact with the support pins.

Considered together, a pod for transporting reticles that comprises an upper cover, an upper liner, a reticle support, a lower liner, and a lower cover, and a reticle transportable in such a pod, the reticle comprising a base with and a metallic coating deposited on a base surface, are made in such a way that the reticle base surface is made free of the metallic coating in selected areas thereof, and the reticle support is provided with pins whose arrangement on the support matches the reticle selected areas when the pins support the reticle. Thus, scratching the metallic coating by the pins and thus releasing metallic particles from the coating is prevented.

The reticle support of the pod can be made in the form of a Π-shape element and the pins are arranged on the opposite legs of the Π-shape support.

Preferably, there are four pins symmetrically arranged by two on the opposite legs of the Π-shaped support.

The lower liner of the pod can be made with a pedestal on an upper surface thereof to thus prevent the reticle from sticking to the surface of the lower liner and thus facilitate unloading the pod.

BRIEF DESCRIPTION OF THE DRAWINGS

The above-identified and other objects, features, and advantages of the present invention will become apparent from the ensuing detailed description and the appended drawings, in which.

DESCRIPTION OF THE PREFERRED EMBODIMENT

Figure 1:
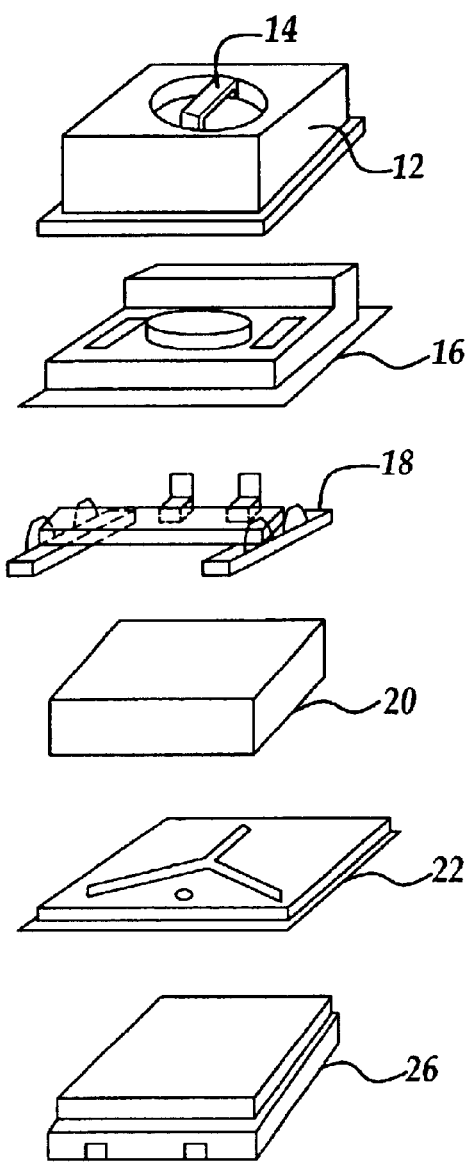
FIG. 1 is an exploded perspective view of a conventional reticle pod.
Figure 2:
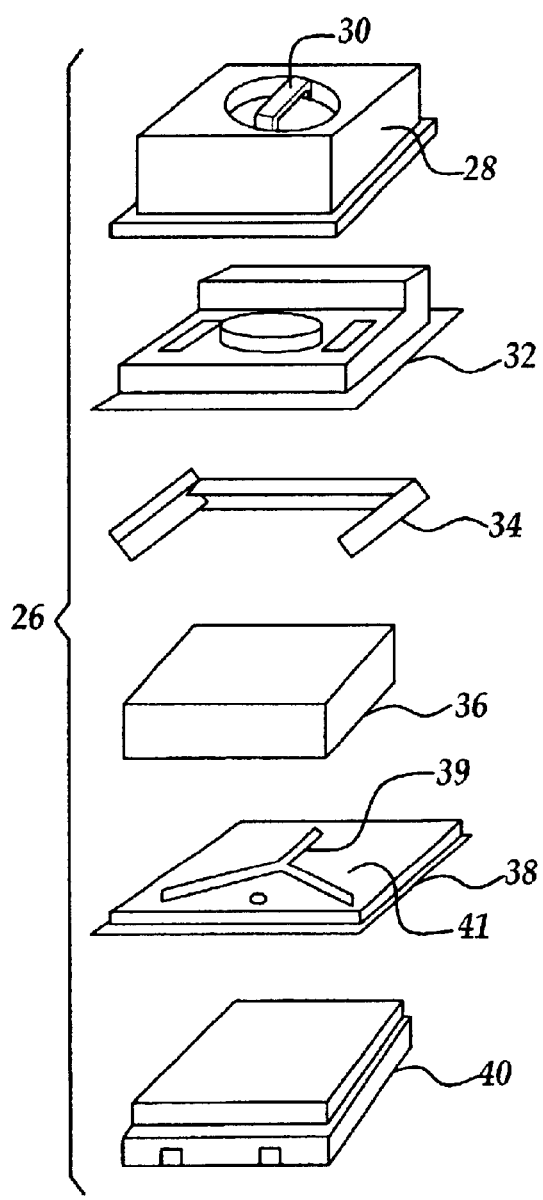
FIG. 2 is an exploded perspective view of a reticle pod according to the present invention.

Referring now to FIG. 2, a reticle pod 26, constituting a container for transporting or transferring reticles in the course of a semiconductor manufacturing process, comprises elements made of an electrically insulating material, such as a polymeric material, to define a sealed, static environment within the container. Shown in FIG. 2 are upper cover 28 with a handle 30 affixed to the upper cover 28 for easy carrying the pod 26 by an operator, an upper liner 32, a support 34 for a reticle base 36, a lower liner 38, and a lower cover 40.

The container elements are preferably formed of a durable polymer. The polymer can be clear to allow the viewing of the reticle. The elements may additionally be static dissipative. An example of a transparent, static dissipative material, from which the pod elements may be formed is polymethyl methacrylate. The pod elements may alternatively be formed of static dissipative, carbon fiber-filled polycarbonate, which is opaque, and include transparent window(s) (not shown), through which the reticle may be viewed. As a further alternative, they may be formed of clear polycarbonate. As an alternative to polycarbonate, the elements may further be formed of flame retardant polyetherimide. It is understood that the pod elements may be formed of other materials in alternative embodiments. They are preferably formed by injection molding, but other known methods of manufacture are also contemplated.

Shown in FIG. 2 is a shaped pedestal 39 formed on a surface 41 of the lower liner 38. The function of the pedestal 39 is to prevent the base 36 from sticking to the surface 41 of the lower liner 38 and thus facilitate unloading the pod 26. Also, the pod 26 can be equipped with a cover latch of the type disclosed in the U.S. Pat. No. 6,340,933, which is assigned to the same assignee and incorporated herein by reference in its entirety.

Figure 3:
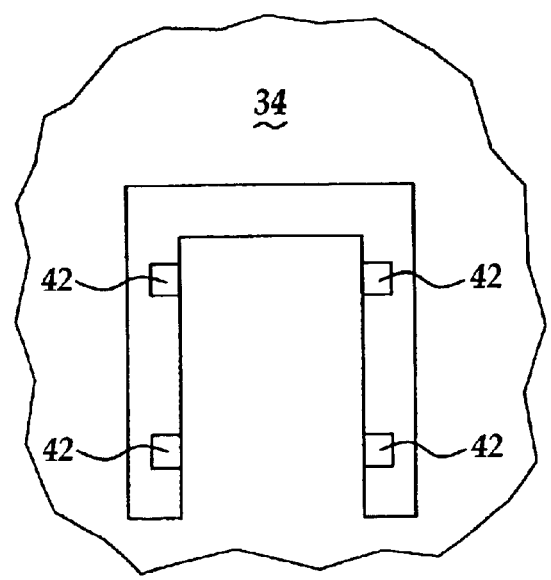
FIG. 3 illustrates a novel support according to the present invention.
Figure 4A:
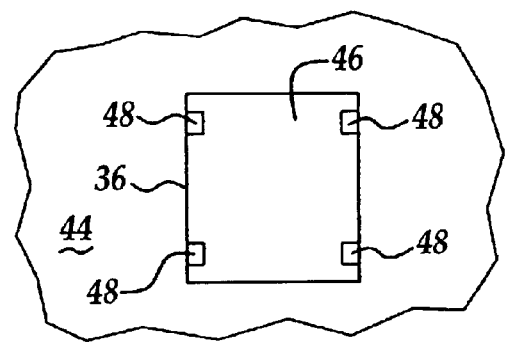
FIG. 4a shows a plan vies of a reticle prepared in accordance with the present invention.
Figure 4B:
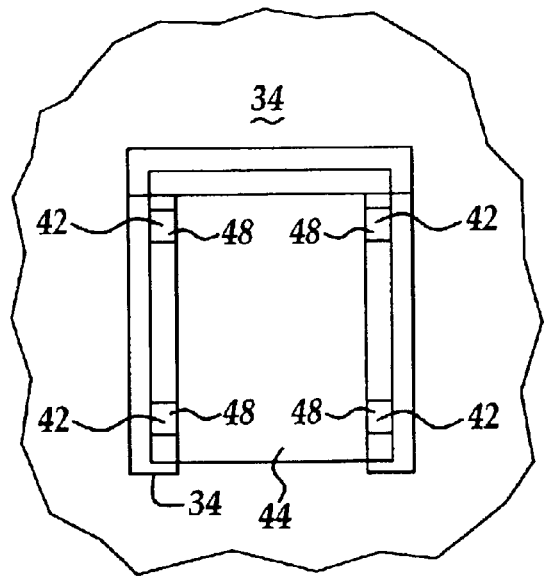
FIG. 4b is a plan view of the reticle covered with the support.

As clearly visible in FIGS. 2, 3, and 4b, the support 34, according to the present invention, is made in the form of a substantially U-shaped or Π-shaped element. The support 34 is provided with identical support pins 42. Preferably, there are four pins symmetrically arranged by two on the opposite legs of the Π-shaped support and schematically shown in FIG. 3. A reticle 44 (FIG. 4a) comprises the base 36 and a metallic layer 46. The base 36 is preferably a quartz blank. A thin patterned opaque metallic layer 46, preferably made of chromium (chrome), is deposited on a surface of the base 36. Typically, the layer 46 is formed with chrome less than 100 nm thick and it is covered with an anti-reflective coating, such as chrome oxide (not shown). In accordance with principles of the present invention, the layer 46 is made with four cuts in the areas 48 of the base 36 where support pins 42 are supposed to come into contact with the reticle 44. In other words, the reticle 44 is made chrome-free in those areas 48.

FIG. 4b illustrates the Π-shaped support 34 placed on top of the reticle 44, with the pins 42 matching and being in contact with the reticle 44 in the chrome-free areas 48 thereof. Due to the above-described structure, the scratching of the reticle chrome coating is prevented from occurring, and thus eliminated is the cause of releasing metallic particles during transportation of reticles.

While the preferred embodiments of the present invention have been disclosed hereinabove, it is to be understood that these embodiments are given by example only and not in a limiting sense. Those skilled in the art may make various modifications and additions to the preferred embodiments chosen to illustrate the invention without departing from the spirit and scope of the present contribution to the art. For example, specific areas of the reticle base surface that are left chrome-free and intended for coming into contact with the support pins may be selected the way they are shown in FIG. 4a (and accordingly, pins are arranged on the opposite legs of the Π-shaped support as shown in FIG. 3), or those areas may be selected in some equivalent way, say, on three rather than two sides of the surface, one area per side. Accordingly, the arrangement of the pins would match the arrangement of the chrome-free areas to avoid scratching the chrome layer. Accordingly, it is to be realized that the patent protection sought and to be afforded hereby shall be deemed to extend to the subject matter claimed and all equivalence thereof fairly within the scope of the invention.

What is claimed is:

1. A pod for transporting a reticle during a semiconductor manufacturing process, and a reticle corresponding to the pod, the reticle comprising a base made of isolating material and a metallic layer deposited onto a surface of a base of the reticle, the metallic layer being cut in selected areas to receive complementary reticle support pins, the pod comprising:

an upper cover, an upper liner, a reticle support, a lower liner, and a lower cover, wherein the reticle support is made in the form of a substantially U-shape element and is provided with complementary reticle pins arranged to contact and match the selected cut areas of the reticle metallic layer and to keep the reticle support from contacting the reticle metallic layer when supporting the reticle, whereby scratching the metallic layer and thus releasing metallic particles from the layer is prevented.

2. The pod as claimed in claim 1, wherein the pins are arranged to come into contact with the reticle in areas of the base surface that are free from the metallic layer.

3. The pod as claimed in claim 1, wherein the lower liner is made with a pedestal on an upper surface thereof to thus prevent the reticle from sticking to the surface of the lower liner and thus facilitate unloading the pod.

4. The pod and reticle as claimed in claim 1, wherein the complementary reticle support pins in eliminate release of metallic particles during transportation of the reticle and retain the reticle when the pins contact the selected cut areas of the article.

5. The pod as claimed in claim 1, wherein the pod further comprised flame retardant polyetherimide.

6. A reticle adapted to be transported in a corresponding pod, and a corresponding pod, the pod comprising a substantially U-shaped reticle support with complementary support pins coming into contact with the reticle, the reticle comprising a base and a metallic layer deposited on the surface of the base, wherein the reticle base is made free from the metallic layer by cuts formed in selected areas of the base surface that come into contact with the support pins, wherein the complementary support pins match the cuts to contact and support the reticle.

7. The reticle as claimed in claim 6, wherein the reticle base is made substantially square and two metallic-free areas are selected on each of the opposite side of the reticle to come in contact with the pins arranged on the legs of the substantially U-shaped support when the reticle is place within the pod.

8. A pod for transporting reticles during a semiconductor manufacturing process, and a reticle transportable in such a pod, the pod comprising an upper cover, an upper liner, a reticle support, a lower liner, and a lower cover, and a reticle comprising a base with and a metallic layer deposited on a base surface, wherein the reticle base surface is made free of the metallic layer in selected areas thereof wherein the metallic layer is cut in selected areas to receive complementary matching support pins, and the reticle support is provided with complementary matching pins whose arrangement on the support matches the selected areas when the complementary matching support pins support the reticle, whereby scratching the metallic layer by the complementary matching support pins and thus releasing metallic particles therefrom is prevented.

9. The pod as claimed in claim 8, wherein the reticle support is made in the form of a substantially U-shaped element and the pins are arranged on the opposite legs of the substantially U-shaped support, whereas the reticle base is made substantially square and two metallic-free areas are selected on each of the opposite sides of the reticle to come in contact with the pins.

10. The pod according to claim 8, wherein the lower liner is made with a pedestal on an upper surface thereof to thus prevent the reticle from sticking to the surface of the lower liner and thus facilitate unloading the pod.

* * * * *